United States Patent
Dickens

(10) Patent No.: US 11,686,770 B2
(45) Date of Patent: Jun. 27, 2023

(54) SYSTEMS AND/OR METHODS FOR ANOMALY DETECTION AND CHARACTERIZATION IN INTEGRATED CIRCUITS

(71) Applicant: GRAMMATECH, INC., Ithaca, NY (US)

(72) Inventor: Jason Alvin Dickens, Newfield, NY (US)

(73) Assignee: GRAMMATECH INC., Ithaca, NY (US)

(*) Notice: Subject to any disclaimer, the term of this patent is extended or adjusted under 35 U.S.C. 154(b) by 5 days.

(21) Appl. No.: 17/397,417

(22) Filed: Aug. 9, 2021

(65) Prior Publication Data

US 2022/0050140 A1 Feb. 17, 2022

Related U.S. Application Data

(63) Continuation of application No. 16/384,188, filed on Apr. 15, 2019, now Pat. No. 11,092,648.

(51) Int. Cl.
| | | |
|---|---|---|
| G01R 31/317 | (2006.01) | |
| G01R 31/3177 | (2006.01) | |
| G01R 31/3185 | (2006.01) | |

(52) U.S. Cl.
CPC . *G01R 31/318519* (2013.01); *G01R 31/3177* (2013.01); *G01R 31/31706* (2013.01); *G01R 31/31725* (2013.01)

(58) Field of Classification Search
CPC ...... G01R 31/318519; G01R 31/31937; G01R 31/31725; G01R 31/3177
See application file for complete search history.

(56) References Cited

U.S. PATENT DOCUMENTS

| | | |
|---|---|---|
| 4,829,521 A | 5/1989 | Southard |
| 5,436,853 A | 7/1995 | Shimohara |
| (Continued) | | |

FOREIGN PATENT DOCUMENTS

| | | |
|---|---|---|
| CN | 102592068 | 7/2012 |
| CN | 108061848 | 5/2018 |
| FR | 3017467 | 8/2015 |

OTHER PUBLICATIONS

"Scalable Algorithms and Design for Debug Hardware for Test, Validation and Security of Mixed Signal/RF Circuits and Systems," Dissertation by Sabyasachi Deyati, Georgia Institute of Technology, Aug. 2017, 247 pages.

(Continued)

*Primary Examiner* — Minh Q Phan
(74) *Attorney, Agent, or Firm* — Nixon & Vanderhye PC

(57) ABSTRACT

Systems, methods, and computer readable medium described herein relate to techniques for characterizing and/or anomaly detection in integrated circuits such as, but not limited to, field programmable gate arrays (FPGAs) and application-specific integrated circuits (ASICs). In one example aspect of certain example embodiments, a fully digital technique relies on the pulse width of signals propagated through a path under test. In another example aspect, the re-configurability of the integrated circuit is leveraged to combine the pulse propagation technique with a delay characterization technique to yield better detection of certain type of Trojans and the like. Another example aspect provides for running the test through reconfigurable path segments in order to isolate and identify anomalous circuit elements. Yet another example aspect provides for performing the characterization and anomaly detection without requiring golden references and the like.

20 Claims, 11 Drawing Sheets

(56) References Cited

U.S. PATENT DOCUMENTS

| | | | |
|---|---|---|---|
| 8,386,990 | B1 | 2/2013 | Trimberger et al. |
| 8,850,608 | B2 | 9/2014 | Tehranipoor et al. |
| 9,081,991 | B2 | 7/2015 | Jyothi et al. |
| 2003/0101396 | A1 | 5/2003 | Price |
| 2007/0168158 | A1 | 7/2007 | Mittal |
| 2009/0271134 | A1 | 10/2009 | Bhushan et al. |
| 2011/0311018 | A1* | 12/2011 | Chen .................. H03K 21/023 377/47 |
| 2013/0019324 | A1 | 1/2013 | Tehranipoor et al. |
| 2014/0103344 | A1 | 4/2014 | Tehranipoor et al. |
| 2014/0347088 | A1 | 11/2014 | Huang et al. |
| 2017/0161485 | A1 | 6/2017 | Aguayo Gonzalez et al. |
| 2020/0326373 | A1 | 10/2020 | Dickens |

OTHER PUBLICATIONS

Mehrdad Majzoobi et al., "Rapid FPGA Delay Characterization Using Clock Synthesis and Sparse Sampling," 2010 International Test Conference, Nov. 2010, 11 pages.

Sabyasachi Deyati et al., "High Resolution Pulse Propagation Driven Trojan Detection in Digital Logic: Optimization Algorithms and Infrastructure," 2014 IEEE 23rd Asian Test Symposium (ATS), Nov. 2014, 6 pages.

Chung Liang Chen et al., "A New Path Delay Test Scheme Based on Path Delay Inertia", in Proceedings of the 13th Asian Test Symposium (ATS 2004), Nov. 15, 2004, pp. 140-144.

Ming-Shae Wu et al., "Crosstalk Fault Detection for Interconnection Lines Based on Path Delay Inertia Principle", in Proceedings of the 14th Asian Test Symposium (ATS 2005), Dec. 18, 2005, pp. 106-111.

Extended European Search Report dated Aug. 28, 2020 in corresponding European Application No. 20169415.5, 15 pages.

International Search Report and Written Opinion dated Jan. 5, 2021 in corresponding International Application No. PCT/US2020/027433, 24 pages.

Office Action dated Apr. 21, 2021 in corresponding Taiwanese Application No. 109112551 (with translation), 17 pages.

International Preliminary Report on Patentability dated Sep. 28, 2021 in corresponding International Application No. PCT/US2020/027433, 9 pages.

\* cited by examiner

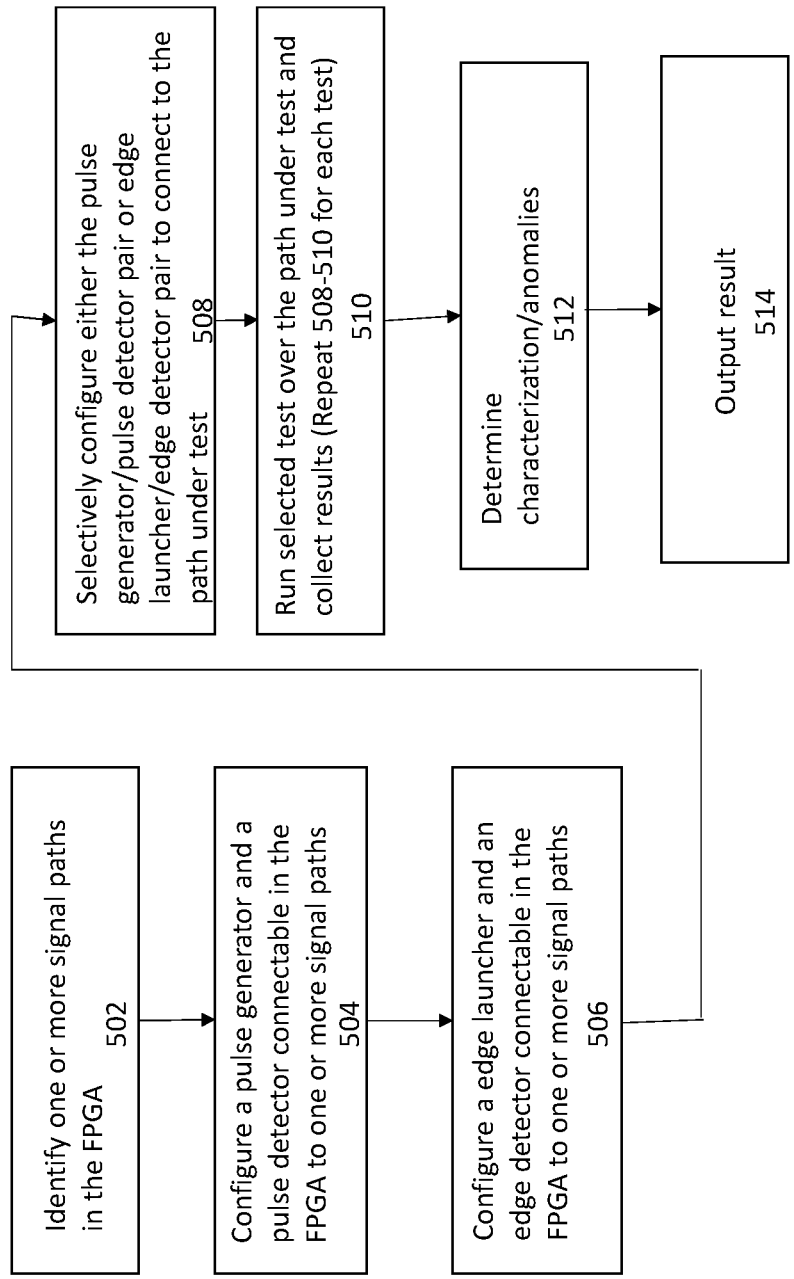

SYSTEMS AND/OR METHODS FOR ANOMALY DETECTION AND CHARACTERIZATION IN INTEGRATED CIRCUITS

CROSS-REFERENCE TO RELATED APPLICATIONS

This application is a continuation of application Ser. No. 16/384,188 filed Apr. 15, 2019, the entire content of which is hereby incorporated by reference in this application.

This invention was made with Government support under Contract FA9453-17-P-0441 awarded by the United States Air Force. The Government has certain rights in the invention.

TECHNICAL FIELD

Certain example embodiments described herein relate to characterization and anomaly detection of device circuitry. More particularly, certain example embodiments relate to characterization and anomaly detection of field programmable gate arrays (FPGAs) and application-specific integrated circuits (ASICs).

BACKGROUND AND SUMMARY

Integrated circuits (ICs) of various complexities are in numerous devices in almost every modern field of use. Because of the prevalence of ICs in every environment, malicious actors may be highly motivated to surreptitiously modify an IC. Such surreptitious modifications may cause a device including that IC to operate in a manner that was not intended by the designer of the IC. One type of surreptitious modification to an IC is the introduction of a malicious modification (typically referred to as a "Trojan") to one or more signal paths in the IC. Because ICs are often produced at various locations throughout the world, reliance on the trustworthiness of the design and manufacturing process and/or personnel is difficult. Thus, it would be desirable to be able to detect malicious modifications to ICs upon receipt from the manufacturer.

Many techniques are currently being used for verifying the design and function of ICs. In some cases, techniques known as "design for trust" (DfT) are used to verify an IC before fabrication, and then to also verify the functionality after fabrication using "design for test" (DFT) techniques and components fabricated into the IC. U.S. Pat. No. 9,081,991 describes DfT techniques such as creating an identity for IC based on circuit path delays, power usage side-channel information, the variations in a ring oscillator, etc. U.S. Publication No. 2017/0161485 describes fingerprinting techniques and signature analysis techniques, and also described monitoring side-channel information generated by an IC executing a set of predetermined codes. U.S. Pat. No. 8,850,608 describes combining on-chip structure with external current measurements for threat detection in an IC. U.S. Pat. No. 8,386,990 describes generating a unique identifier for an IC based on an intrinsic characteristic of the IC and using that unique identifier to detect malicious modifications. The entire contents of each of these patent documents is hereby incorporated by reference herein.

Although currently available techniques have varying levels of success at detecting Trojans and other malicious modifications in ICs, it would be desirable to provide further techniques to test and detect anomalies in view of the broad variety of the threats and the wide range of ICs potentially at risk.

Systems, methods, and computer readable medium described herein relate to techniques for characterizing and/or anomaly detection in integrated circuits such as, but not limited to, field programmable gate arrays (FPGAs) and application-specific integrated circuits (ASICs). In one example aspect of certain example embodiments, a fully digital technique uses the pulse width of signals propagated through a path under test. In another example aspect, the re-configurability of the integrated circuit is leveraged to combine the pulse propagation technique with a delay characterization technique to yield better detection of certain type of Trojans and the like. Another example aspect provides for running the test through reconfigurable paths in order to isolate and identify anomalous circuit elements. Yet another example aspect provides for performing the characterization and anomaly detection without requiring golden references and the like.

Certain example embodiments relate to a system for characterizing and/or testing a circuit. A pulse generator is incorporated in the circuit and coupled to a signal input point of at least one active signal path in the circuit and configured to generate a sequence of pulses of varying pulse widths for propagation through the at least one active signal path. A pulse detector is incorporated in the circuit and coupled to a signal output point of the at least one active signal path and configured to detect respective pulses in the sequence of pulses propagated through the at least one active signal path.

According to certain example embodiments, the pulse generator may be further configured to include pulses of varied widths in the sequence such that the pulse widths of respective pulses in the sequence are changed according to a predetermined distribution. In the circuit, one or more elements in the at least one active signal path may amplify pulses having a pulse width larger than a characteristic pulse width and may attenuate pulses having a width less than the characteristic pulse width.

According to certain example embodiments, a processor may be configured to characterize the at least one signal path based on the predetermined distribution and the detected pulses in certain example embodiments, e.g., with the characterizing potentially comprising, based on the generated sequence of pulses, determining a characteristic pulse width such that, from pulses in said sequence, pulses having a width less than the characteristic pulse width fail to propagate to the pulse detector and pulses having a width not less than the characteristic width propagate to the pulse detector. The processor may be further configured to detect differences in circuit capacitive loading in the at least one active signal path based on pulse width of detected pulses; detect differences in circuit capacitive loading in the at least one active signal path, modifications in one or more logic gates in the at least one active signal path, and modifications in circuit aging in the at least one active signal path; and/or the like.

According to certain example embodiments, the system may in some instances comprise a FPGA, with the FPGA including the circuit. In such systems, for example, the pulse generator, the pulse detector, and the at least one active signal path may entirely comprise digital logic located on the FPGA. In some instances, the system may further comprise an ASIC, with the ASIC including the circuit.

According to certain example embodiments, the circuit may be reprogrammable, e.g., such that all logic elements, nets, and programmable interconnect points within the circuit are included in an active signal path between the pulse generator and the pulse detector.

According to certain example embodiments, the pulse detector may be further configured to use edge detection capabilities of a flip-flop device to count a number of received pulses, e.g., where the first flip-flop device in a ripple counter may be used for the edge detection.

According to certain example embodiments, the pulse generator may be further configured to generate pulses by logically combining two clock signals that are generated by on-chip clock generation circuitry of the circuit, e.g., with the two clock signals having differing clock frequencies such that each clock period generates a different pulse width from said logical combining. In some instances, the pulse generator may be further configured to control the pulse widths of the respective pulses in the sequence by changing a difference in frequencies in the logically combined clocks, the pulse generator may be configured to change the widths of pulses in the sequence alternating between increasing and decreasing by a fixed amount between two extremes, etc.

According to certain example embodiments, one or more delay measuring circuits may be incorporated in the circuit, e.g., where the delay measuring circuits are configured to measure the delay in the at least one active signal path. In some instances, the delay measuring circuits may include an edge launch circuit and an edge capture circuit configured to provide for detection of a time between launch and detection of a signal on the at least one active signal path. In some instance, the circuit may be reconfigurable to alternately enable the pulse generator and the edge launch circuit to transmit on the at least one active signal path. In some instances, the at least one active signal path may comprise multiple path segments, and the circuit may be further reconfigurable to propagate signals from the pulse generator or the edge launch circuit over alternate paths that include less than all segments of the at least one active signal path. In some instances, the processor may be further configured to identify anomalous elements in the circuit based on signals detected at the pulse detector and/or the edge detector, e.g., with the detected signals potentially including signals propagated over the at least one active signal path and signals propagated over said alternate paths. In some instances, the circuit may be reconfigurable to alternately enable the pulse generator and the edge launcher to transmit signals along signal paths such that multiple elements of a selected location on the circuit are alternately included in respective ones of the paths, and the processor may be further configured to determine an expected value for a path under test and one or more expected values for the selected location based on data detected from the said signals transmitted along signal paths.

In certain example embodiments, a method for characterizing and/or testing a circuit is provided, with the method comprising configuring a pulse generator in the circuit, the pulse generator being coupled to a signal input point of at least one active signal path in the circuit and configured to generate a sequence of pulses of varying pulse widths for propagation through the at least one active signal path; and configuring a pulse detector in the circuit, the pulse detector being coupled to a signal output point of the at least one active signal path and configured to detect respective pulses in the sequence of pulses propagated through the at least one active signal path.

In certain example embodiments, there is provided a non-transitory computer-readable storage medium having instructions stored therein, the instructions, when executed by at least one processor of a computer, causing the computer to perform operations comprising: configuring a pulse generator in a circuit, the pulse generator being coupled to a signal input point of at least one active signal path in the circuit and configured to generate a sequence of pulses of varying pulse widths for propagation through the at least one active signal path; and configuring a pulse detector in the circuit, the pulse detector being coupled to a signal output point of the at least one active signal path and configured to detect respective pulses in the sequence of pulses propagated through the at least one active signal path.

In addition to the features of the example method and non-transitory computer-readable storage medium outlined in the two previous paragraphs, features including those set forth in the paragraphs preceding those may be used in connection with such embodiments.

These aspects, features, and example embodiments may be used separately and/or applied in various combinations to achieve yet further embodiments of this invention.

BRIEF DESCRIPTION OF THE DRAWINGS

These and other features and advantages may be better and more completely understood by reference to the following detailed description of exemplary illustrative embodiments in conjunction with the drawings, of which:

FIG. 5 is a flowchart of a process providing for the pulse propagation testing as in FIG. 3 and delay characterization testing to be performed on the same path under test, according to certain example embodiments;

DETAILED DESCRIPTION

Figure 1:
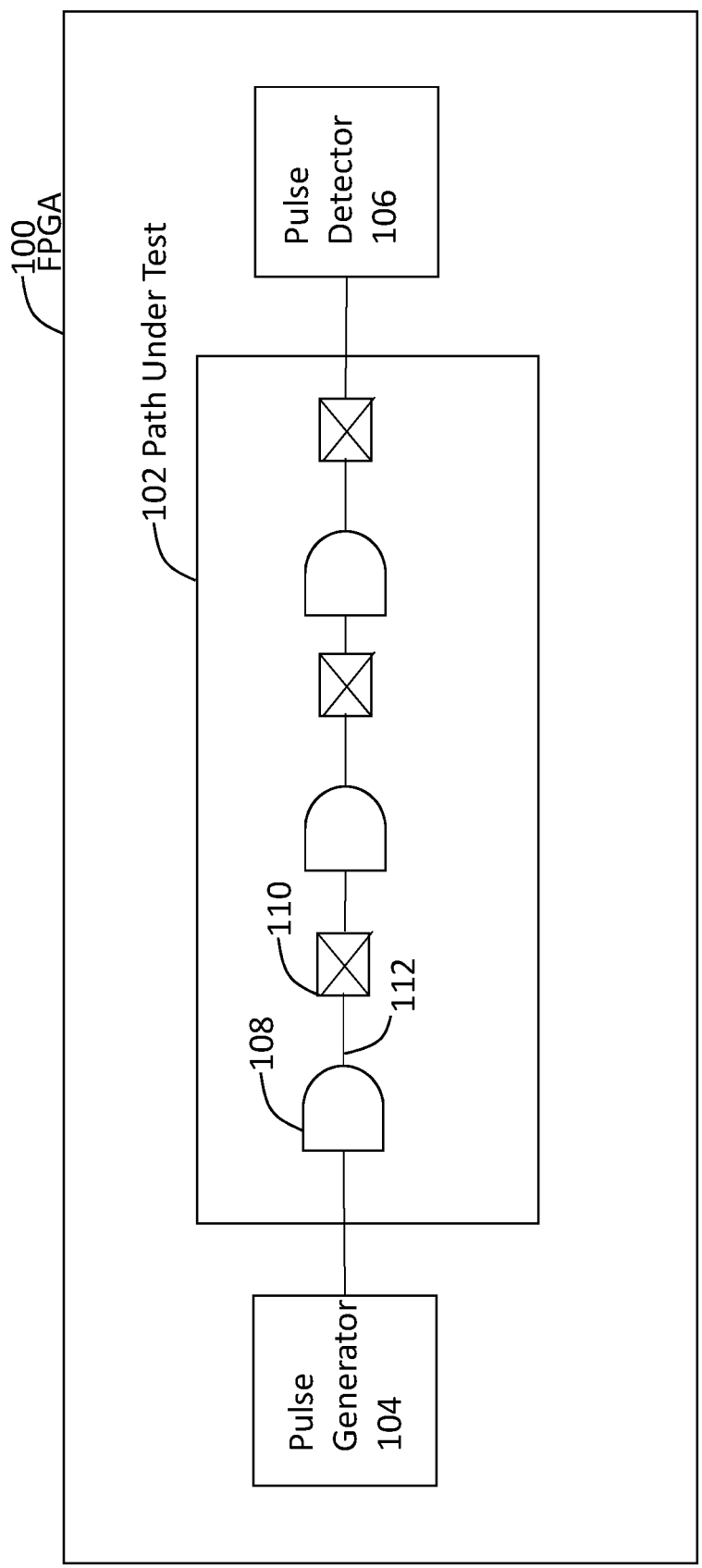
FIG. 1 is a block diagram schematic illustration of an integrated circuit such as, for example, an FPGA, including a test fixture in accordance with certain example embodiments.

Certain example embodiments provide hybrid integrated circuit (IC) characterization and data analysis techniques capable of highly-sensitive detection of anomalies Certain example techniques include an all-digital approach to characterizing and isolating capacitance variation in a device's digital circuits (such as, for example, FPGAs), without requiring hardware modification and/or a golden reference. The all-digital test technique is capable of detecting very small differences in circuit capacitive loading, logic gate modification, and circuit aging.

The techniques of certain example embodiments use existing circuit paths and logic to propagate pulses of varied widths between source devices and destination devices within the device under test. Devices along these paths will amplify the strength of such pulses when their widths are above a characteristic minimum value. Pulses below this critical width are attenuated by each successive logic gate in the path until they fail to propagate all the way through the path. Characterization of the path is performed by varying the width of repeated pulses sent through the test path and noting the threshold at which pulses fail to pass. The techniques of certain example embodiments improve conventional integrated circuit characterization and testing techniques in that, among other things, it becomes possible to perform the testing using only digital logic available on standard FPGAs (e g Xilinx Virtex5™, Xilinx Zynq™, Xilinx UltraScale™, Xilinx Kintex™, Altera Stratix™, Altera Arria™, Altera Cyclone™) or the like.

Further improvements to the technique are achieved in some instances by incorporating a complimentary delay-based characterization approach to strengthen detection. In some embodiments, the delay-based characterization approach can be used as an alternative to the pulse-width based characterization approach. Still further, in certain example embodiments, either approach or the combination of both approaches are further improved through innovative characterization of systematic variation in the device and removal of a characterized variation from the measurements to enhance the anomaly detection capability.

The techniques of example embodiments can be used to detect anomalies such as, but not limited to, malicious circuit modification, reliability issues, and component aging effects in commercial off-the-shelf FPGA devices using only the hardware resources existing on the devices. The techniques may also be used in ASIC devices incorporating design for trust techniques to verify trustworthiness of a device instance. The data resulting from the techniques in certain example embodiments can also be used in understanding device-specific variation of circuit characteristics and/or to improve design placed on FPGA/ASICs.

Certain example embodiments provide for characterization of capacitive load without the need for FPGA signal path modification, and employ all-digital approaches, leveraging only existing FPGA capabilities. The techniques of certain example embodiments use digitally generated pulse width variation with predictable distribution, and digital pulse presence detection. Certain example embodiments provide increased detection sensitivity for all classes of hardware Trojans inserted in integrated circuits, and certain embodiments provide hybrid detection in order to strengthen detection of anomalies. Certain example embodiments may also provide for detailed localization of circuit anomalies, provide anomaly detection without a golden reference, and/or provide a technique for extraction of systematic device variations.

FIG. 1 is a block diagram schematic illustration of an IC 100 in accordance with certain example embodiments. Leveraging the re-programmability of the IC 100, which is an FPGA in this example, multiple test paths 102 are created. This enables characterization of logic elements, nets, and programmable interconnect points within the FPGA 100. According to certain embodiments, the test path 102 may include all logic elements, nets, programmable interconnects, and/or other logic elements on the FPGA 100. In certain example embodiments, the test path 102 may include a selected subset of the logic elements, nets, programmable interconnects, and the like, on the FPGA 100. Test path 102 may be one of numerous (e.g. thousands or millions) signal paths configured on the FPGA 100.

In FIG. 1, one path comprising three logic gates (e.g., logic gate 108), three programmable interconnects (e.g., interconnect 110), and nets (e.g., net 112) connect the various logic elements along the path. The types of logic elements along a path may include logic gates and programmable interconnects, but are not limited thereto. The path under test 102 shown in FIG. 1 is a simplified path. Each path under test may include any number and any types of logic elements in different instances.

According to certain example embodiments, a pulse generator 104 and a pulse detector 106 are connected to the one or more paths under test 102 so that signals generated by the pulse generator 104 can be transmitted through the one or more paths under test 102 and are received at the pulse detector 106. Although the number and type of nets, logic gates, programmable inter-connect and the like that are used can vary, certain example embodiments make use of an active signal path between the pulse generator and pulse detector that allows a pulse of sufficient width (e.g., a pulse having a width within a predetermined range of pulse widths) to propagate from the pulse generator to the detector.

As is known, additional capacitive loading on a gate in the signal path will increase the required pulse-width that is necessary for successful propagation through the gate. It follows that modifications to the logic gates can also result in a change in the pulse width required for successful propagation. This leads to the recognition that the critical pulse width observed is a measure of the capacitive loading and the design of the gates in the path. Furthermore, by observing the results of a known distribution of pulse widths passed through the path under test, changes in the path can be characterized.

U.S. Pat. No. 9,081,991 (entitled "Ring oscillator based design-for-trust") and U.S. Pat. No. 8,850,608 (entitled "Embedded ring oscillator network for integrated circuit security and threat detection") both describe design-for-trust techniques. According to both the patents, circuits specifically for testing are added to the chip design (whether ASIC or FPGA). The former appears to suggest building a ring oscillator around the path under test and detect frequency changes relative to a golden reference value. The latter appears to propose a side-channel approach based on measuring impact on transient power usage (e.g. not delay or pulse), with the frequency of ring oscillator placed in the part being used as a measure of transient power usage. Some other conventional approaches provide for direct control of the width of each generated pulse and thus can establish the propagation threshold by sweeping this value across a selected range of widths. In contrast to the above noted conventional techniques, certain example embodiments do not require any of the introduction of additional circuitry to the IC, an analog pulse generator or an analog detector. Certain example embodiments also do not require the addition of circuitry not already present in the device to be tested. For example, certain example embodiments do not require circuitry that is not present in a standard commercially available FPGA.

In contrast to the above-mentioned U.S. patents, certain example embodiments use a fully digital approach to generating a sequence of pulses having a known distribution of pulse widths, while giving up specific control of the width of each pulse. For example, in certain example embodiments, the pulse width of each subsequent pulse is set according to the selected distribution, and no individual pulse's width is adjusted in a manner that is not consistent with the selected distribution of pulse widths. Additionally, in certain example embodiments, pulse detection is accomplished by using the edge detection capability of a standard flip-flop device to count the number of pulses which are received. By noting the number of pulses received over a defined period of time and knowing the distribution of pulse widths generated during that period, the critical pulse width can be calculated. In certain example embodiments, the critical pulse width is the smallest pulse width that is propagated through the path under test from the pulse generator to the pulse detector with sufficient signal strength remaining to be detected by the pulse detector as a signal corresponding to a pulse transmitted by the pulse generator.

In certain example embodiments, pulse generation is achieved by logically combining (e.g., logically ANDing) two clock signals that are generated by the existing clock generation circuitry within the integrated circuit being tested. Multiple approaches exist within integrated circuits such as FPGAs to generate clocks at various frequencies including on-chip phase locked loops (PLLs), on-chip digital clock control modules (DCMs), and logic feedback to create oscillation. Certain example embodiments may use any of such techniques that produce two clocks of differing frequency. When the generated frequencies of the two clock frequencies are not the same, each clock period generates a different pulse width from the AND circuit. By selecting clock frequencies that are near each other, very narrow pulse widths can be generated with a small increment or decrement in width after each cycle. Certain example embodiments use a sequence of pulse widths that alternate between increasing and decreasing by a fixed amount between two extremes to stimulate the path under test (PUT).

Moreover, in contrast to conventional approaches, certain example embodiments may use a ripple counter to provide a fully digital detector of the number of pulses that propagate to the end of the path under test. The edge detection capability of the first flip-flop in the counter is used to detect each pulse received at the pulse detector, as the received pulses are no longer synchronous to any clock nor are they necessarily full strength. After the first flip-flop is used to detect a received pulse, various synchronization approaches can be applied to implement the remaining count and data collection circuitry synchronously.

Figure 2:
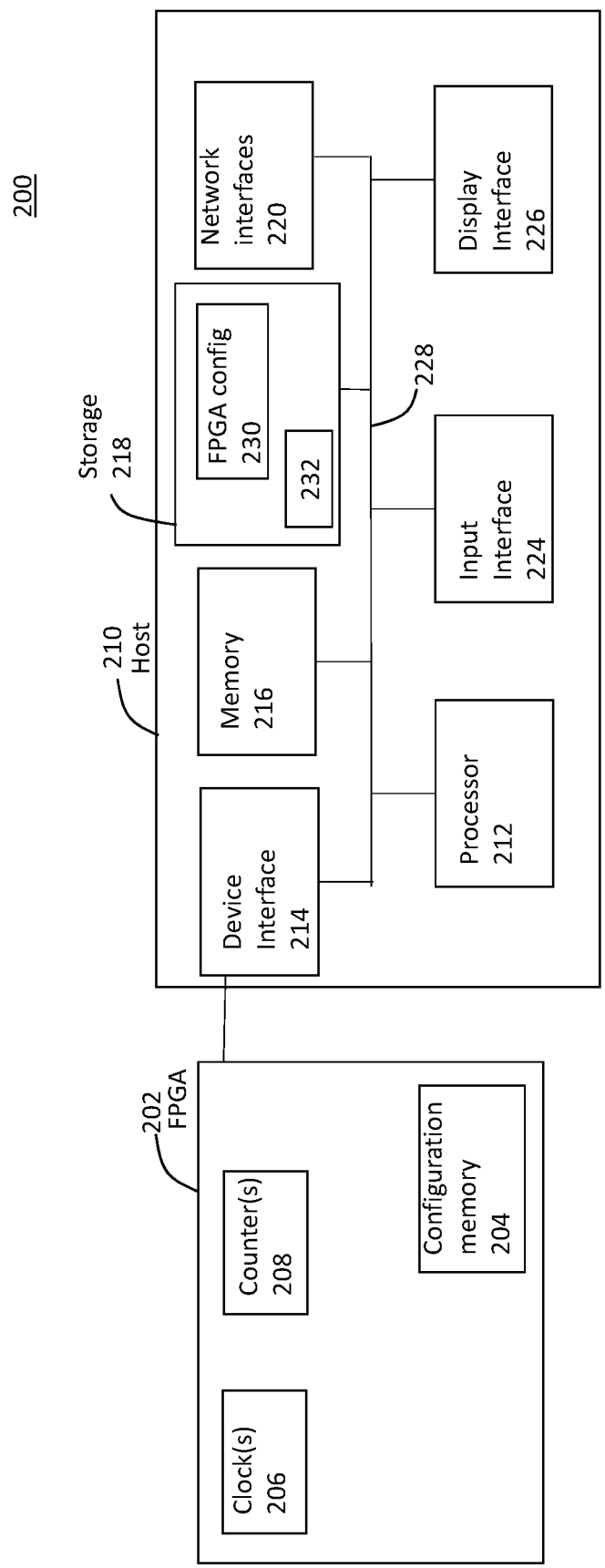
FIG. 2 schematically illustrates a system for characterizing and performing anomaly detection of an integrated circuit such as that shown in FIG. 1, according to certain example embodiments.

FIG. 2 schematically illustrates a system for characterizing and performing anomaly detection of an IC, according to certain example embodiments. The system 200 includes an IC 202 subject to test and a host system including a processor 210 that is connected (or is detachably connected) to the IC 202.

According to certain example embodiments, the IC 202 may be an FPGA or the like, which is configured each time it is powered on. In certain example embodiments, the IC 202 may also be reprogrammed partially or fully while is powered on. IC 202 may, for example, include a configuration memory 204 that is erased when the IC 202 is powered off. Configuration memory 204 may include a static RAM (SRAM) or the like, which can receive and store the configuration information for the IC 202. The configuration information may, for example, specify the configuration of signal paths, logic elements along signal paths, input logic blocks, output logic blocks, clocks, counters, registers etc., on the IC 202. Upon being powered on, the configuration information may be received in the configuration memory 204 from the host 210, and the IC 202 may be configured in accordance with the received configuration information. For example, in certain example embodiments in which the IC 202 includes the pulse generator, pulse detector, and the path under test shown in FPGA 100, the configuration information may include the path configuration for each of the signal paths that may be a path under test 102, the pulse generator 104 and the pulse detector 106.

The host 210 includes a processor 212, which may control the configuration of the IC 202. The host 210 may include elements such as a device interface 214, memory 216, storage 218, network interface(s) 220, input interface(s) 224, display interface(s) 226, interconnected by one or more intercommunication buses 228. Certain example embodiments may have elements in addition to those listed above, and one or more listed elements may not be present in host 210 in certain other embodiments. In the illustrated IC 202, clock(s) 206 and counter(s) 208 are also configured. As described above, in certain example embodiments, the pulse generator may utilize two clock signals that are available on the IC 202 to generate the pulse sequence, and the pulse detector may use a counter, such as a ripple counter that is already present (e.g., configured using already existing circuitry in the FPGA) in the IC 202, to detect received pulses.

The host 210 may store the configuration information 230 in its volatile memory 216 and/or in permanent memory 218 (e.g., FLASH, hard disk, etc.). The configuration information 230 may be downloaded to the IC 202 via the device interface 214, which may include one or more of a serial interface, parallel interface, or JTAG interface that can connect to the host interface on the IC 202. The downloaded configuration information 230 is stored in the configuration memory 204 for use in configuring the circuitry of the IC 202.

The memory 216 and/or storage 218 may also include an anomaly detection program 232 that may be run by the processor 212 in order to analyze the results collected by the characterization and anomaly detection components in the IC 202. For example, program 232 may analyze the pulse detection information collected by the pulse detector 106 in order to determine a characterization of the path under test 102 and/or to detect anomalies in the path under test 102. The pulse detection information collected by the pulse detector 106 may be stored in a memory such as memory 204 on the IC 202. In certain example embodiments, however, the pulse detection information may be communicated to the host 210 without being stored on the IC 202. The anomaly detection program 232 may use input devices (e.g., keyboard, mouse etc.) connected via input interface 224 to receive user input and/or a display connected via display interface 226 to display results of analysis to users.

It will be appreciated that the host components 212-228 are not limited to any particular types of hardware, and may include any combination of components that enables the configuration of the IC 202 and, at least in certain example embodiments, the running of the anomaly detection program 232. The configuration information may be specified in any hardware description language such as, for example, VHDL, Verilog, etc.

In certain embodiments, the IC 202 and the host 210 may each be a standalone device. In certain other embodiments, however, system 200 may be formed as a system-on-a-chip (SoC), which includes a microprocessor (e.g., processor 212) and a circuit such as IC 202. The IC 202 or the SoC 200 may be incorporated in any type of digital electronic device.

Figure 3:
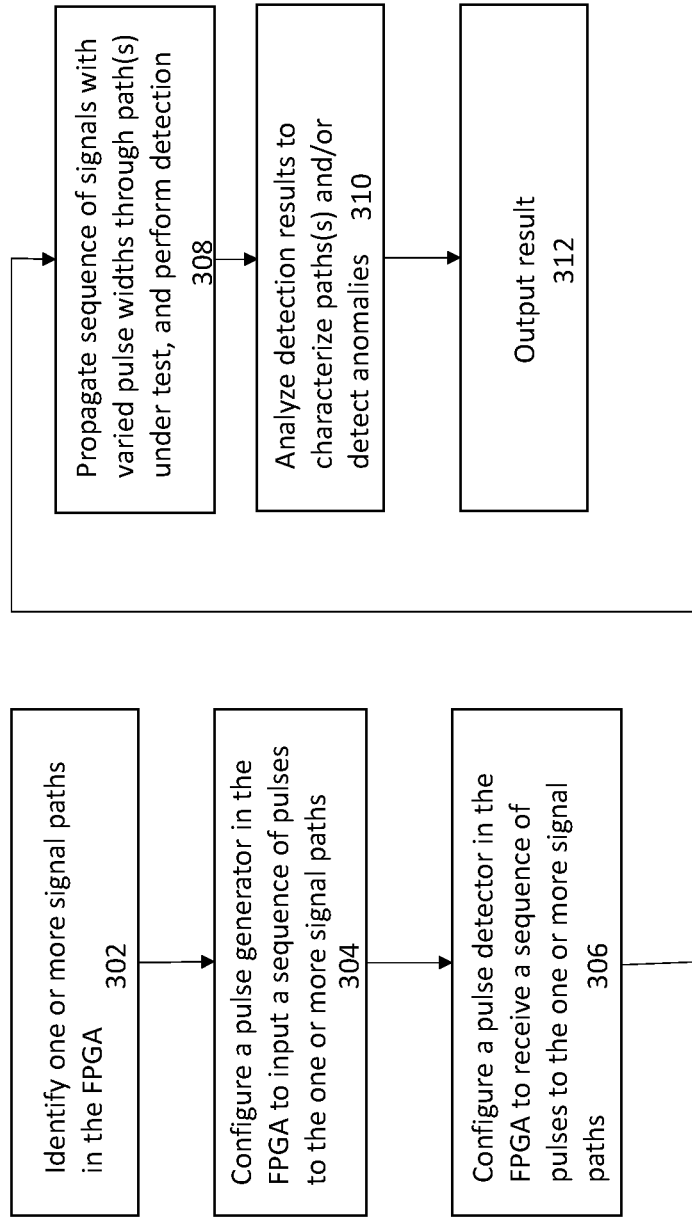
FIG. 3 provides a flowchart of a process for characterizing and/or performing anomaly detection of an integrated circuit such as that shown in FIG. 1, according to certain example embodiments.

FIG. 3 is a flowchart of a process 300 for characterizing and/or performing anomaly detection of an integrated circuit, according to certain example embodiments. The program instructions for process 300 may, for example, be included in configuration information 230 and/or anomaly detection program 232. According to certain example embodiments, process 300 may be performed on the system 200. More particularly, the IC under test may be the FPGA 202 also including a pulse generator, pulse detector, and path under test such as that shown in FIG. 1.

After entering the process 300, at operation 302, one or more signal paths are identified in the IC under test. For example, a particular signal path from one or more paths may be determined as the path under test 102 in this operation. The determination can be based on an already created circuit configuration (such as, for example, configuration information 230 of the FPGA 202) or during the creation of the circuit configuration 230.

In certain example embodiments, one or more signal propagation paths on the IC under test are determined so that all logic elements that can be active in an application is in at least one signal path under test. In certain other example embodiments, one or more signal paths can be selected as paths under test from a plurality of paths that may be active during the application.

At operation 304, a pulse generator is configured on the IC under test. For example, the pulse generator 104 may be configured on the IC under test. As described above, the pulse generator is configured to generate a sequence of signals having a known distribution of pulse-widths. The pulses may be generated, in certain example embodiments, by ANDing two clock signals (e.g., clocks 206) that are on the IC under test. Two clocks close to each other produce a sequence of varying pulse widths with a known distribution. In certain example embodiments, the AND of clock signals near each other in frequency may be used to produce narrow pulse widths, and the frequency difference between the selected clock signals can be increased in order to produce larger pulse widths. As described above, the sequence of pulse widths may alternate between increasing and decreasing the pulse width by a fixed amount between two extremes to stimulate the path under test. For example, a pair of clocks at 100 Mhz and 100.01 Mhz differ in period by 1 ps. Therefore, for each cycle of the 100 Mhz clock the 100.01 Mhz will be advanced in relative phase by 1 ps. ANDing these clock signals produces a pulse where these two square-wave clocks overlap. How long they overlap during each cycle depends on their relative phases, which as just indicated changes by 1 ps every 100 Mhz clock cycle (10 ns). It should be noted that this is cyclic relationship as the relative phase grows beyond ½ a clock cycle (at which pulse width is produced) the signals may again begin to overlap an increasing amount. Therefore, a sequence of pulse-widths may be created that ramp back and forth between a maximum of approximately 5 ns (½ of the period of the 100.01 Mhz clock), and 0 ns in 1 ps increments.

At operation 306, a pulse detector is configured on the IC under test. For example, the pulse detector 106 may be configured on the IC under test. According to certain example embodiments, the pulse detector may be configured to use a counter 208 such as, for example, a standard ripple counter that is implemented in the logic available on standard FPGAs. As described above, the edge detection capability of the first flip-flop of the ripple counter may be used for detecting respective pulses in order to improve the robustness of the detection.

At operation 308, a sequence of pulses is transmitted from the pulse generator, through the one or more paths under test, to the pulse detector. For example, pulse generator 104 transmits the sequence of signals having varying pulse widths through the paths under test 102. The transmitted signals propagate through the path under test (through each logic element and net along the path under test) and are received at the pulse detector 106 after they have propagated through the path under test 102.

At operation 310, the detected signals at the pulse detector are analyzed. The analysis may yield a characterization of one or more of the paths in the paths under test 102. The analysis may also yield the capability to detect anomalies in one or more of the signal paths. As described above, certain example embodiments make use of the pulse width that can propagate through logic elements along the path under test. Because additional capacitive loading on a logic gate in the path will increase the required pulse width needed for successful propagation through the gate, a characterization of the pulse width distribution that is propagated through the path under test may detect a modification and/or the attaching of additional logic to a path under test. In certain example embodiments, the characterization and anomaly detection may be based upon known capacitive thresholds of each type of various logic elements along each signal path in the path under test, the known transmitted pulse sequence, the selected path under test, and the detected pulse sequence. In one example implementation, a sequence of pulses of a common distribution of pulse-widths are propagated through a set of equivalent paths under test and then counted at the detectors. Using these count values, the mean and standard deviation of the collection of count values is determined. These statistical values are characteristic of the design of the path under test. Then, individual count values that vary beyond a specified deviation from the calculated mean will indicate that the path tested is not the expected path and may have been modified.

At operation 312, the determination is output. For example, program 232 or the like may be output the result to a display attached to the display interface 226 (e.g., to a display device or the like). The output may indicate identification and/or description of the transmitted pulse sequence, information regarding the pulse sequence detected at the pulse detector, detected pulse width characteristics, and a description and/or illustration of one or more signal paths in the path under test. After operation 312, the process 300 terminates.

According to certain example embodiments, operations 302, 310, and 312 may be performed by (or using) program 232 and/or other software being executed on processor 212. Operations 304, 306, and 308, however, may be performed in certain example embodiments on the IC under test, using the configuration information provided from the host 210 to the configuration memory 204 on the IC under test.

Figure 4A:
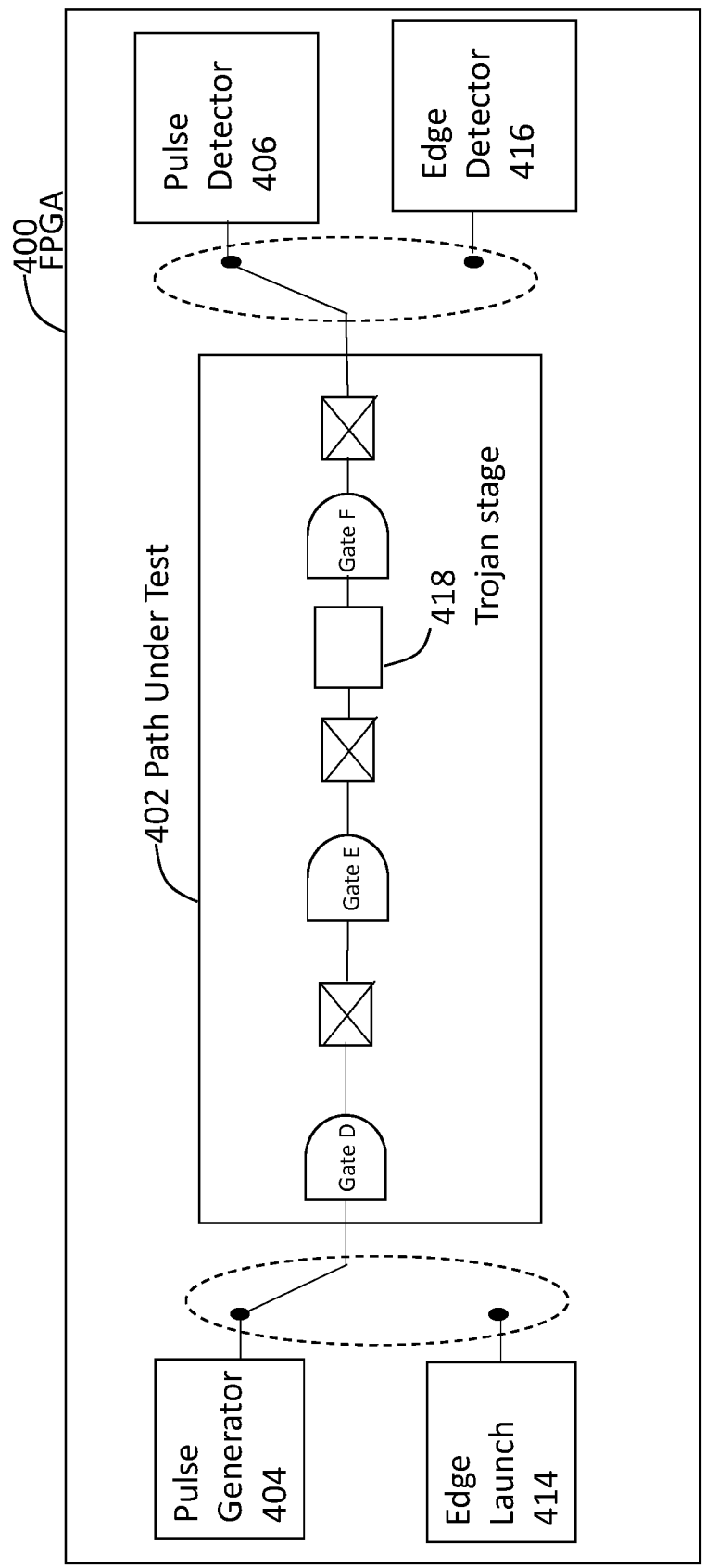
FIG. 4A illustrates an FPGA having an inserted Trojan within a path under test, and having configured therein a pulse generator, a pulse detector, an edge launch circuit, and edge detector circuit, according to certain example scenarios.
Figure 4B:
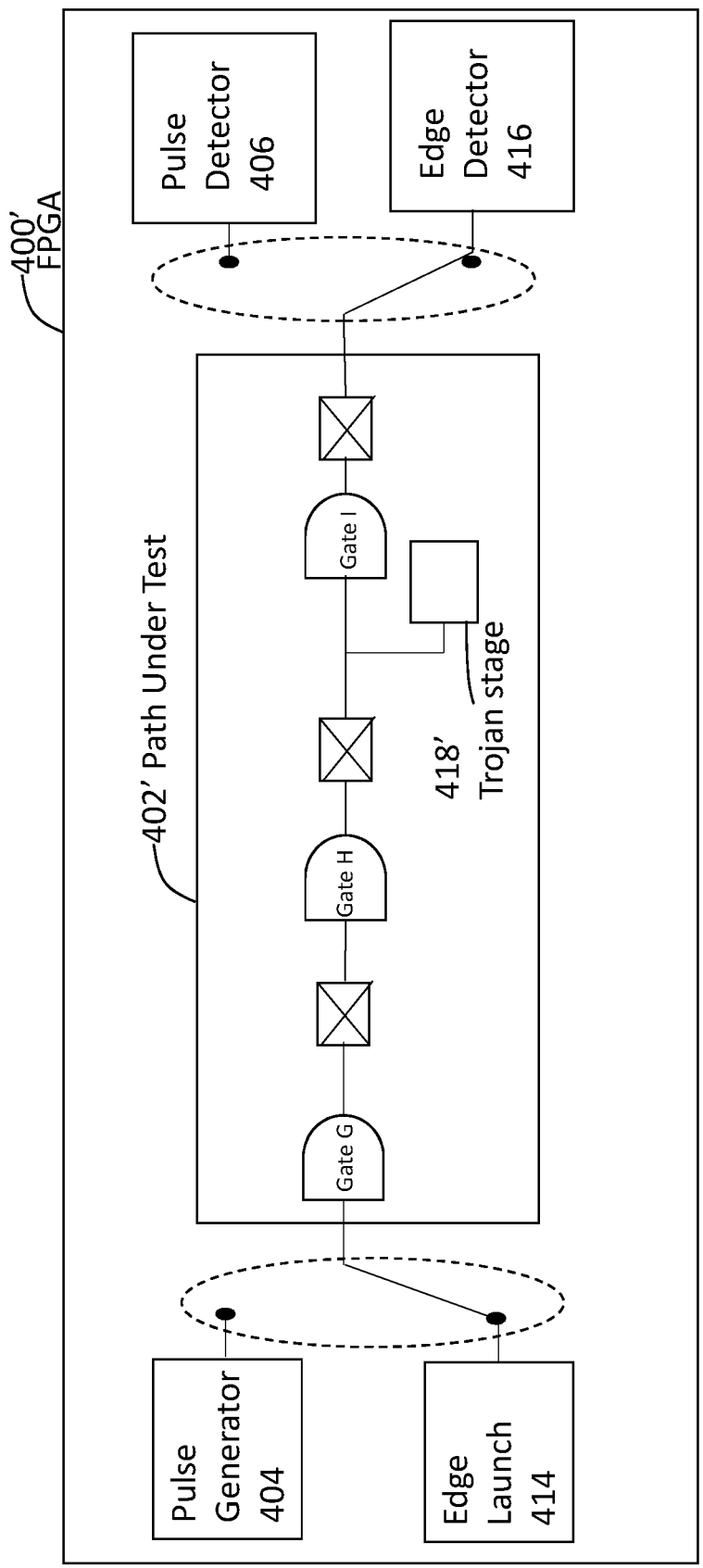
FIG. 4B illustrates an FPGA similar to that shown in FIG. 4A, but with the Trojan having been inserted in a manner different (i.e., attached to the path under test) from that in FIG. 4A, according to certain example scenarios.

Certain example embodiments improve the characterization and anomaly detection capabilities of the techniques described in relation to FIGS. 1 and 3 by including the combining of the pulse propagation test approach described in relation to FIGS. 1 and 3 with a compensating delay-based detection test approach and the leveraging the re-programmability of the IC under test (e.g., FPGA) to prevent (or at least reduce the likelihood of) the escape of some circuit variations from detection. FIGS. 4A and 4B illustrate example FPGA configurations according to certain example embodiments with the improved capability.

The pulse-propagation technique, as described above in relation to FIGS. 1 and 3, detects the pulse width threshold of the critical stage in the path under test. That is, the gate and gate load in the path under test that requires the largest pulse width for successful propagation is detected. As noted above, the pulse-width threshold for each stage along the path should be very similar among the same type of stage because the logic gates, nets, and programmable interconnect within an FPGA are designed to be substantially uniform. However, with only the pulse propagation technique discussed in relation to FIGS. 1 and 3, it might be possible for a malicious user to specifically design an additional malicious path stage (e.g., a Trojan) that is not the critical stage and thus not detected. That is, whereas the pulse propagation technique can detect a path under test in which the critical stage logic element is affected by a Trojan, it may not detect a Trojan that does not contribute to the capacitive threshold of the critical stage.

Because the inserted additional malicious stage has to pass the pulse without providing additional load to the prior path stage (e.g., if the malicious stage provides additional load to the prior path stage it may be detected by the pulse propagation), the inserted malicious stage must be configured by the malicious user to have gain of its own and thus would add significant delay into the path. By combining the pulse-propagation detection approach with a delay measuring approach (such as, for example, clock sweeping), the combined hybrid approach can provide improved anomaly detection including the capability to detect special cases such as the insertion of crafted malicious stages or the attachment of small Trojans to path nets, which may be missed by either approach individually.

Delay characterization approaches for Trojan detection exist (e.g., see U.S. Publication No. 2014/0103344, entitled "Detection of Recovered Integrated Circuits", the entire contents of which are hereby incorporated herein by reference). However, conventional techniques do not combine a delay characterization approach with a capacitive load based approach (e.g., pulse propagation) for more comprehensive detection capabilities. FIGS. 4A and 4B illustrate an example embodiment in which elements along a path under test are re-used during multiple configurations to use pulse propagation in combination with the delay characterization to yield more comprehensive anomaly detection capabilities.

FIG. 4A illustrates an IC 400 (e.g., an FPGA) having configured therein a pulse generator 404, a pulse detector 406, an edge launch circuit 414, and edge detector circuit 416, and a path under test 402. As described in relation to IC 100 above, the path under test 402 may represent a particular path from one or more signal paths in the IC, with each path including a combination of elements such as logic gates, nets, and programmable interconnects. IC 400 may also include a configuration memory, clock(s) and counter(s) such as that described in relation to IC 202 (e.g., configuration memory 204, clocks 206 and counters 208).

As shown in FIG. 4A (and also in FIG. 4B), in a given configuration, only the pulse generator 404 along with the pulse detector 406, or the edge launch circuit 414 along with the edge capture circuit 416 is configured and connected to the path under test 402. The alternate connections (e.g., connector to pulse generator/detector pair or connector to edge launch/detect circuit pair) shown in FIG. 4A represent the option to flexibly configure pulse propagation or the delay characterization along the same path under test. The edge launch and edge capture approach, represent one of many existing delay measurement techniques that can be employed. By detecting the time between launch and detection, the delay through the circuit is characterized in certain example embodiments. Both configurations are tested for each path under test.

In a first example scenario shown in FIG. 4A in which a Trojan stage 418 has been inserted inline in the path under test 402, the added delay of the Trojan 418 will be detected by the delay measurement even if it is carefully hidden from the pulse-propagation technique. In a second example scenario shown in FIG. 4B, the attached Trojan 418' in the path under test 402' in the IC 400' will add load to logic gate H and thus be detectable by the pulse-propagation technique. Even though, not shown, the pulse propagation technique also detects parametric Trojans or the coupling of signals from the net. Thus, the hybrid combination approach enables detection of a wider variety of known hardware Trojan insertion methods.

The capability provided in example embodiments in IC configurations such as that shown in FIGS. 4A and 4B to re-configure the IC (e.g., FPGA) multiple times for testing enables the delay test to be performed on the same path under test as the pulse propagation test. As noted above, whereas the pulse propagation test would often detect both types of Trojans 418 and 418', it may miss a carefully crafted Trojan 418. Whereas delay test would often miss Trojan 418', the pulse propagation test would most likely detect it. They are suited to being used as complementary approaches.

FIG. 5 illustrates a process 500 that enables the pulse propagation test described in relation to FIG. 3 above, and the delay characterization test to be run on the same path under test. According to certain example embodiments, process 500 may be performed by program 232 being executed on the host 210. The reconfiguration and testing may be performed on an IC connected to host 210, such as the FPGA 202, which may also include the configuration described in relation to FIGS. 4A and/or 4B.

After entering the process 500, at operation 502, a path under test is selected from one or more signal paths. Selecting the path under test can be performed, for example, as described above in relation to operation 302 shown in FIG. 3.

At operation 504, the pulse generator and pulse detector are configured. The pulse generator and the pulse detector configuration may be performed as described above in relation to FIG. 3.

At operation 506, the edge launcher and edge detector are configured. The edge launcher and edge detector can be configured in any manner that facilitates detecting the time interval between the launch of a signal at one end of the path under test and the detection of that signal at the other end of the path under test. A known technique of delay measurement can be used.

At operation 508, the IC is selectively reconfigured to connect either the pulse generator/pulse detector pair or the edge launcher/edge detector pair to the path under test. According to certain example embodiments, the FPGA 400 may be configured as shown in FIG. 4A to connect the path under test to the pulse generator and pulse detector. The unselected pairing may not be connected to the path under test.

At operation 510, the selected test is run on the path under test. For example, when the pulse generator/pulse detector pair is connected, the pulse propagation test is run as described above in relation to FIG. 3.

Operation 508-510 is repeated to reconfigure the IC to separately connect both pulse generator/pulse detector and edge launcher/edge detector pairs to the path under test and perform the respective tests. When reconfigured for the delay characterization test, the edge launcher and the edge detector may be connected to the path under test as shown in FIG. 4B.

At operation 512, the result data obtained from the pulse propagation test and the delay characterization test for the same path under test are analyzed to determine path characterizations and any anomalies that are present.

At operation 514, some of the detected information may be output to a display or the like. After operation 514, process 500 terminates.

In addition to the capability to run the pulse propagation and delay characterization tests on the same path under test, the re-configurability of ICs such as FPGAs and the like, in certain example embodiments, also provide the ability to strengthen the detection by testing path segments in multiple different ways. In certain example embodiments, testing a path segment in multiple different ways is performed by including the path segment in alternative equivalent paths under test. Some example path configurations for implementing this are shown in FIG. 6.

Figure 6:
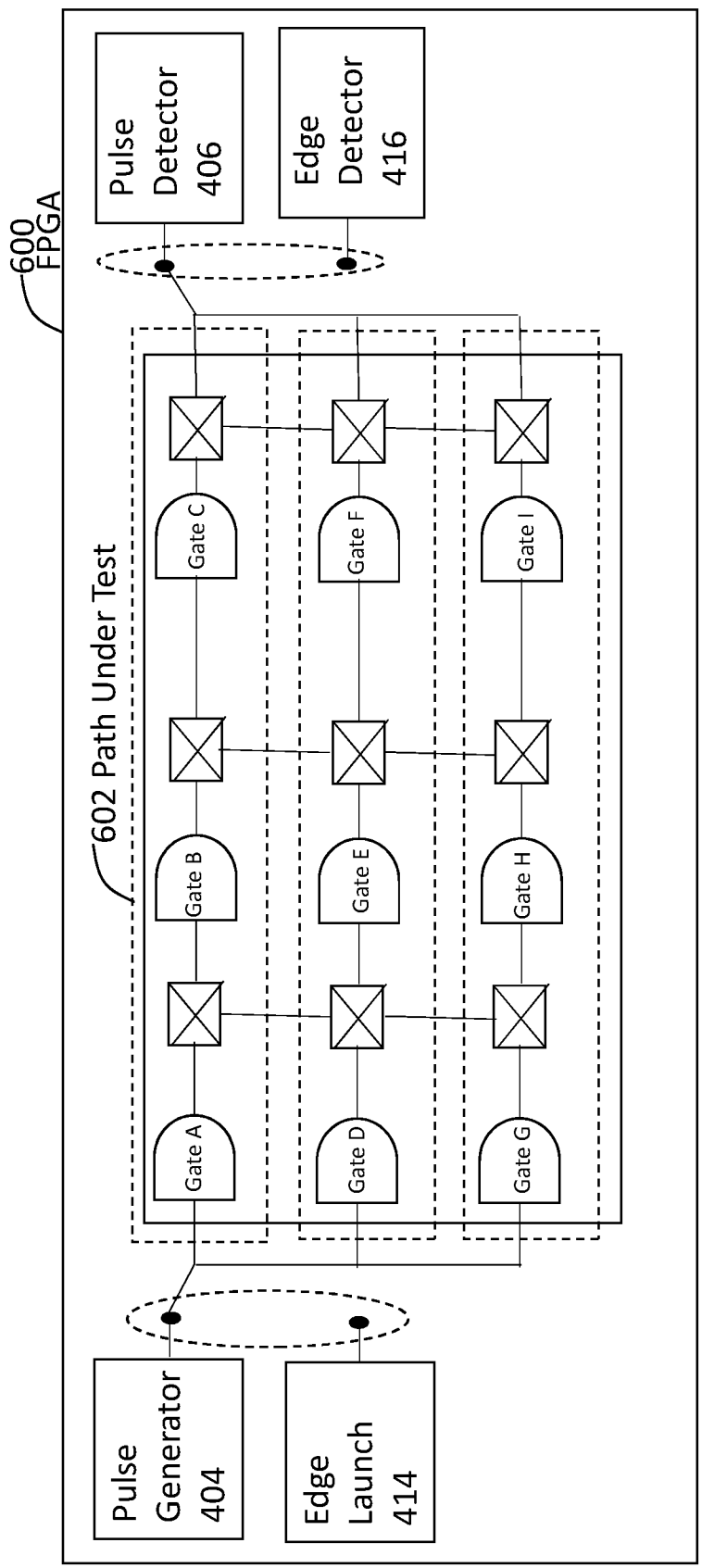
FIG. 6 illustrates an FPGA configured for testing a path segment in multiple different ways by including the path segment in different equivalent path configurations, according to certain example embodiments.

Many different paths can be configured for the logic elements shown in the IC 600 (e.g., FPGA) in FIG. 6. For illustration, a signal path can be represented by the letters of the gates the path traverses. For example, path ABC (i.e., a path including gates A, B and C) may have a gate that determines the pulse width limit for this path. However, other paths can be used to isolate (and thereby identify) the gate in path ABC that sets this limit. For example, assume, without loss of generality, that the minimum pulse width required for path ABC is less than that of path DEF and path GHI. Then testing path AEF will determine if gate A is the limiting case for path ABC. If it is, the value of this new paths should have the same limit as path ABC. Similarly, other combinations of gates can be used to isolate path segments both for determining delay measurements and determining pulse width limits.

This ability to characterize each path segment and the ability to reconfigure the test to incorporate all elements of the IC logic fabric (e.g., FPGA logic fabric) individually, enables certain example embodiments to identify the detailed location of an anomaly or Trojan within the IC.

Figure 7:
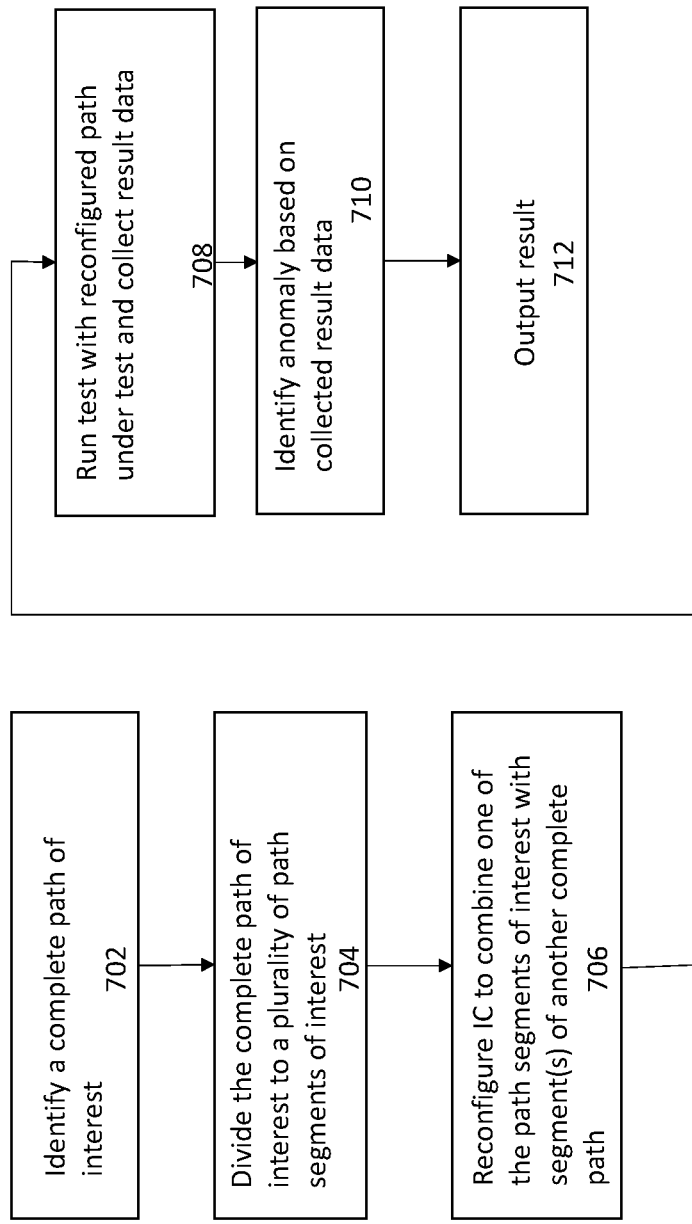
FIG. 7 is a flowchart of a process enabling one or both the pulse propagation test and the delay characterization test to be performed in a configuration for testing a path segment in multiple different ways, according to certain example embodiments.

FIG. 7 illustrates an example process 700 for performing the anomaly identification described above in relation to FIG. 6, according to certain example embodiments. According to certain example embodiments, process 700 may be performed by program 232 being executed on the host 210. The reconfiguration and testing may be performed on an IC connected to host 210, such as the FPGA 202 which may also include the configuration described in relation to FIG. 6. The required configuration information may be generated by program 232 and transferred to the FPGA 202 via configuration information 230.

After entering process 700, at operation 702 a path of interest in which an anomaly is present is identified. The path of interest may be a path under test which was subjected to one or both the pulse propagation test and the delay characterization test. An anomaly may have been detected with respect to the result data obtained for the path of interest in one or both types of tests. The identified path of interest is a complete path from the pulse generator and/or edge launcher to the pulse detector and/or edge detector. For example, in FIG. 6, the path of interest may be ABC.

At operation 704, the identified path of interest is divided into multiple segments. The segments are identified in a manner that it can lead to the isolation and identification of the logic element or elements that causes the detected anomaly. Thus, the segments may be of the same or different lengths and/or may include the same or different numbers and types of logic elements. In one example, each segment includes one logic gate and one programmable interconnect. In the chosen example of the path of interest ABC, the respective segments may be a first segment including only gate A, a second segment including only gate B, and a third segment including only gate C.

At operation 706, the IC (e.g., FPGA) is reconfigured to route a new path combining a portion of another path and a segment of the path of interest. For example, the new path may be AEF, which combines a portion of the ABC path with that of the DEF path.

At operation 708, one or both of the pulse propagation test and the delay characterization test are run on the new path (i.e., the new path under test), and the result data collected. The execution of the tests and collection of data may be performed in a manner similar to that described in relation to FIGS. 3 and 5.

Operations 706-708 may be repeated for multiple new paths under test. For example, each of the segments in the path of interest may be incorporated in at least one new path under test so that the anomaly can be isolated and identified to a particular segment of the path of interest. In the chosen example, operations 706-708 may be repeated for each new path under test AEF, DBF, and DEC.

At operation 710, the result data obtained for the various reconfigured paths under test are analyzed to isolate the previously detected anomaly to a particular segment of the path of interest. If the segments were selected appropriately, this would enable the identification of the anomalous logic element.

At operation 712, the result such as the detected anomaly and the location of the anomaly may be output to a display or the like. After operation 712, process 700 is terminated.

In certain example embodiments, the hybrid pulse propagation and delay characterization of the above described embodiments may be further improved to detect anomalies without the use of expected values, or so-called "golden references." In this regard, certain example embodiments may measure an array of equivalent paths and then normalize the values using identified systematic variation in the IC under test. Normalizing the values so that they can be treated as equivalent enables numerous mathematical approaches to anomaly detection to be applied. It also enables Trojan detection without needing predetermined expected values which are sometimes referred to as golden references. Instead, the expected value is derived as the mean of the normalized measured values.

Certain example embodiments that operate without golden references may ignore any variation that affects the entire IC equally. Such global offsets may be the die-to-die variation or even the temperature of the test. This is because all of determined values are to be normalized and the mean value, which would include such variation in all values, is removed. This is accomplished by assuming physically local variation is less than the global variation observed on the chip.

The IC is divided into an array of locations. An equivalent path under test is tested at each location. For each location, multiple variations of one of the tests described above are used to establish a mean value for this location. Then all measurements taken for this location are adjusted by this mean to normalize the data and to remove the systematic variation observed for this location. The individual tests performed at the location have a systematic variation of their own as the paths used cannot be precisely the same. However, this variation can be extracted using the path mean of all of the equivalent path variations in all locations on the chip. Thus, the path variation can also be removed to provide normalization of this data. The result is an array of equivalent data values. These data values have a mean and standard deviation associated with them. Anomalies or Trojans can be observed as normalized values above a selected variance from the mean value.

Figure 8:
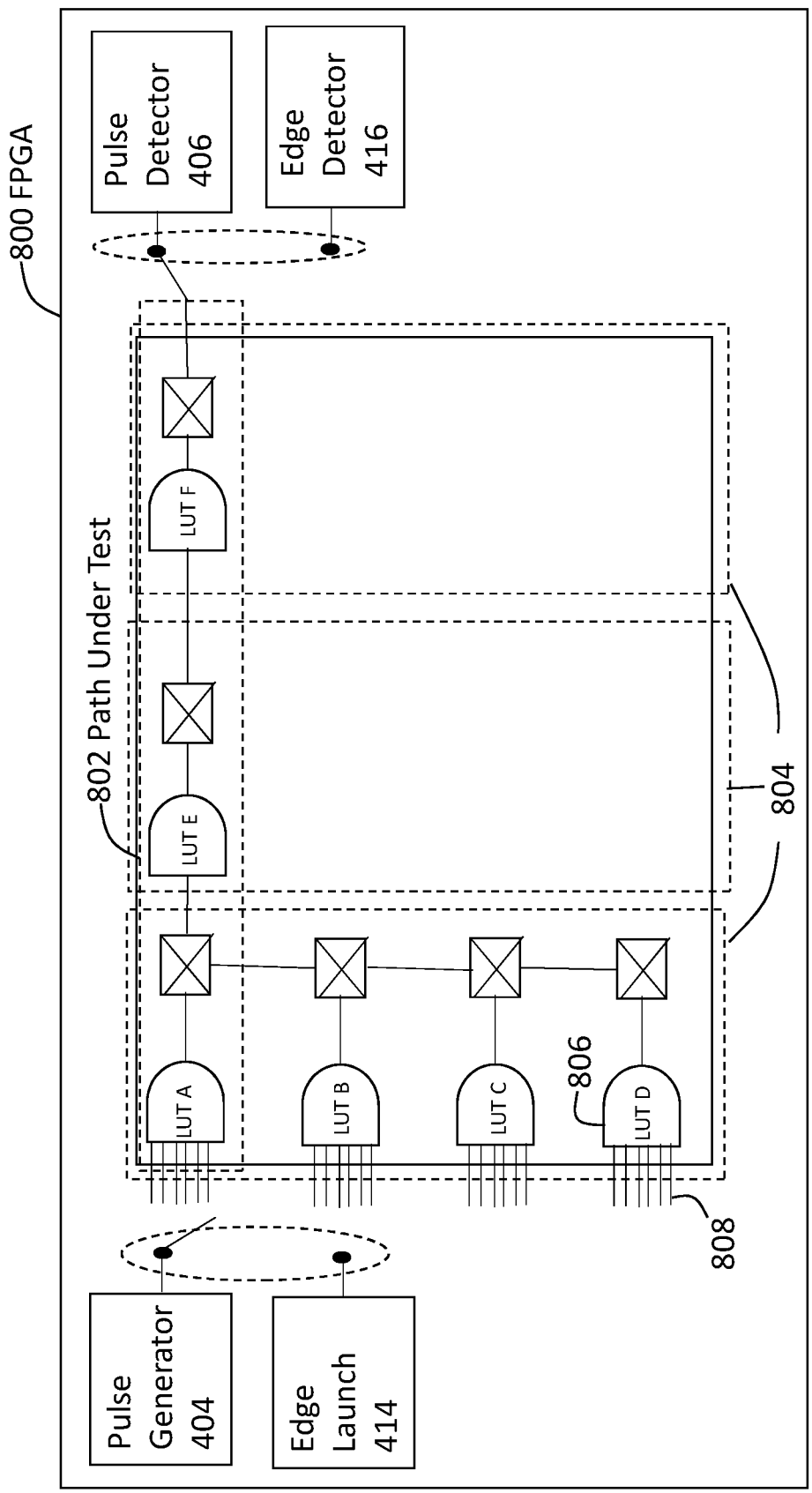
FIG. 8 illustrates an FPGA with an example logic configuration used to extract the location mean and path means, according to certain example embodiments.

For the purpose of illustrating the approach, an example of this process is described. An example logic configuration used to extract the location mean is shown in FIG. 8. This logic configuration may be replicated in the IC at all, or substantially all, equivalent circuit locations. The model used for illustration purposes may be an FPGA 800 with an array of logic slices 804. Each logic slice 804 may contain sufficient look-up tables (LUT) 806 to provide the path under test 802. Each LUT 806 in the example of FIG. 8 may be considered as serving the function of a logic gate in the descriptions above in relation to FIGS. 4 and 6. However, each LUT has multiple inputs 808. For concreteness, a non-limiting example of six inputs per LUT and four LUTs per slice may be specified. The defined location may be considered to be the location of the first slice in the path under test.

In the illustrated scenario, each test may be executed 24 times—once for each combination of LUT input and selection of LUT in the first slice (i.e., the left most slice 804). For reference, each input and LUT combination may be labeled with a path number 1 through 24. Because all of the LUTs in the first slice are located in approximately the same place on chip, the 24 chosen paths vary only in a systematic change in signal routing. Also, because equivalent versions of these 24 paths are measured at other locations in the IC, this systematic change can be determined. For each path number, all of the paths with this number measured in the IC are averaged to create a path mean. This path mean is then subtracted from each value to remove the systematic variation caused by path variation from the data.

Thereafter, the average of the adjusted data for the 24 paths at each location can be used to estimate the location mean. The test is repeated for all slices 804 in the path under test and at all (or substantially all) equivalent locations in the IC to provide a complete set of location means.

As a result of this process, both the location mean and path mean are removed from every value and have produced the normalized data needed for golden reference free detection.

Because all of the resulting normalized values retain their association with their physical position, within the chip, detailed localization results directly from any anomaly detected.

Figure 9:
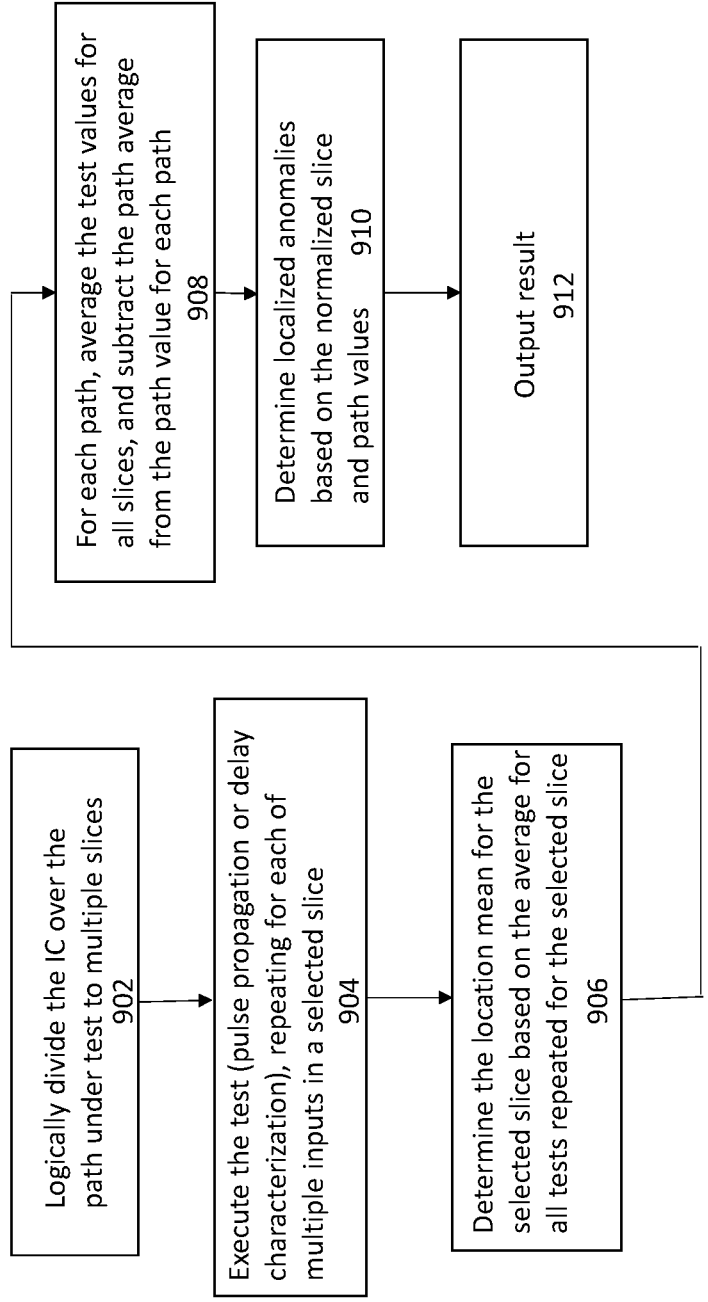
FIG. 9 is a flowchart for a process for performing the detection of anomalies without the use of golden references, according to certain example embodiments.

FIG. 9 illustrates a process 900 for performing the detection of anomalies without the use of golden references, according to certain example embodiments. According to certain example embodiments, process 900 may be performed by program 232 being executed on the host 210. The reconfiguration and testing may be performed on an IC connected to host 210, such as the FPGA 202 which may also include the configuration described in relation to FIG. 8.

After entering process 900, at operation 902, the IC is divided to multiple logical slices such that the path of interest extends over multiple slices. FIG. 8 illustrates the path under test 802 being divided into three separate slices 804.

At operation 904, repeatedly reconfigure the IC, and execute one or both of the pulse propagation test and the delay characterization test, for respective paths under test respectively comprising each of multiple logic elements (and each of multiple inputs of each logic element). For example, the repeated reconfiguration may include providing for the pulse generator/pulse detector pair or the edge launcher/edge detector pair to be alternately connected to each configured path under test, where the path under test is reconfigured to utilize multiple logic elements in each slice over time. As noted above, in the configuration shown in FIG. 8, the tests are repeated for 24 different paths to utilize each of the inputs of each of the logic elements in the first slice.

At operation 906, the mean location value for each slice for each type of test is determined by calculating the average of the resulting value for all the tests of a particular type of test repeated for that slice. For example, in the example configuration shown in FIG. 8, the location value for the first slice for the pulse propagation test will be the average of all 24 paths including the respective input/logic element pairing in the first slice.

At operation 908, for each path, average the test values for all slices, and subtract the path average from the path value for each path.

At operation 910, localized anomalies are determined based on the normalized slice and path values. Anomalies or Trojans can be observed as normalized values above a selected pre-selected variance from the mean value.

At operation 912, results are output, and thereafter the process 900 may be terminated.

Figure 10:
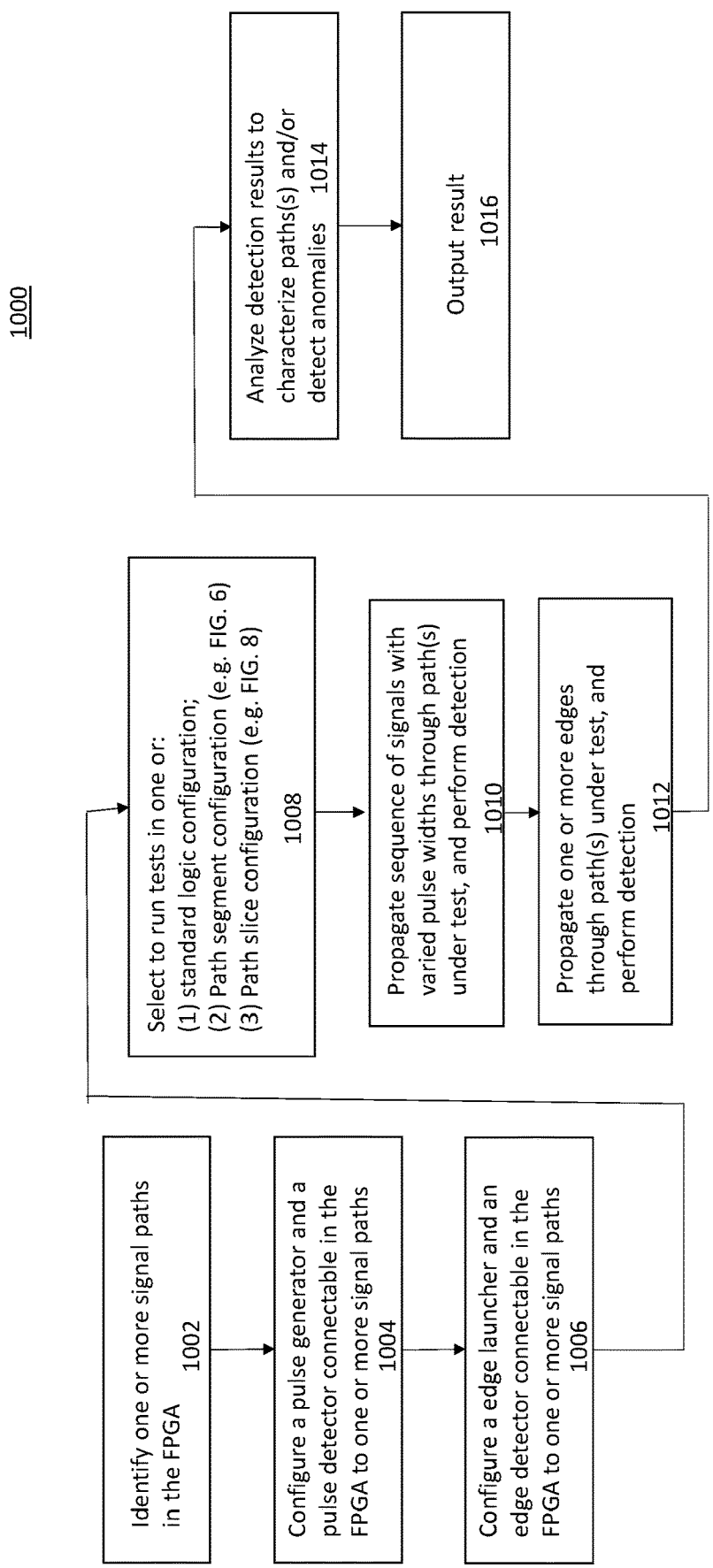
FIG. 10 illustrates a flowchart for a process for characterization and anomaly detection that combines the pulse propagation of the process illustrated in FIG. 3 with one or more of the delay characterization, testing of alternative physically equivalent paths, and extraction of the location mean and the path mean, according to certain example embodiments.

FIG. 10 is a flowchart for a process 1000 for characterization and anomaly detection that combines the pulse propagation of the process 300 illustrated in FIG. 3 with one or more of the delay characterization, identifying anomalous path segments by testing multiple alternative equivalent paths, or extraction of the location mean and the path mean, according to certain example embodiments.

After entering process 1000, at operation 1002 one or more signal paths are determined as the paths under test. Selecting the path under test can be performed, for example, as described above in relation to operation 302 shown in FIG. 3.

At operation 1004, the pulse generator and pulse detector are configured, and at operation 1006, the edge launcher and edge detector are configured. The operations 1004 and 1006 may be performed in a manner similar to that described above in relation to FIGS. 3 and 5.

At operation 1008, a particular configuration of the path under test is selected for running the tests. For example, one of (1) the standard mode, (2) path segment test mode as, for example, in FIG. 6, or (3) path slice test mode as, for example, shown in FIG. 8, is selected. In the standard mode, the path under test is configured as in FIGS. 1 and 4 to extend from the pulse generator/edge launcher to the pulse detector/edge detector. In the path segment test mode, a particular signal path is tested by decomposing that signal path into multiple segments and testing the segments in separate combinations such as described in relation to FIG. 6. In the path slice test mode, a selected path under test is tested by slicing the IC as shown in relation to FIG. 8, and testing the separate slices.

At operation 1010, the pulse generator and pulse detector are connected to the path under test. A sequence of pulses is transmitted from the pulse generator, through the one or more paths under test to the pulse detector. For example, pulse generator 104 transmits the sequence of signals having varying pulse widths through the paths under test 102. The transmitted signals propagate through the path under test (i.e., through each logic element and net along the path under test) and are received at the pulse detector 106 after they have propagated through the path under test 102.

At operation 1012, the edge generator and edge detector are connected to the path under test. A plurality of edges are generated and propagated through the path under test.

At operation 1014 the detected signals at the pulse detector and/or the edge detector are analyzed. The analysis may yield a characterization of one or more of the paths in the paths under test 102. The analysis may also yield the capability to detect anomalies in one or more of the signal paths. As described above, certain example embodiments make use of the pulse width that can propagate through logic elements along the path under test. Because additional capacitive loading on a logic gate in the path will increase the required pulse-width needed for successful propagation through the gate, a characterization of the pulse width distribution that is propagated through the path under test may detect a modification and/or attaching additional logic to a logic gate. In certain example embodiments, the characterization and anomaly detection may be based upon minimum pulse width thresholds (e.g. pulse width corresponding to capacitive thresholds) of each type of various logic elements along each signal path in the path under test, the known transmitted pulse sequence, the selected path under test, and the detected pulse sequence. The thresholds are determined from the test data without being known a priori, thus enabling operation without a golden reference. An example of one variation of the approach to detect anomalies in an FPGA is described below. An array of circuit equivalent paths are found distributed across the FPGA. In all, a set of such arrays are found that cover all elements to be tested in the FPGA. For each PUT in each array a test is constructed by combining the PUT with a pulse generator/edge launcher and pulse detector/edge detector as indicated in FIG. 8. Using the measurement methods previously described the raw minimum pulse-width/delay value is determined for each PUT in the array.

Prior to detection, the raw data is normalized through additional tests that include the path variation test to determine local means as indicated in FIG. 9. Each point in the array may experience a different local mean and local path means determined as previously described. These values are subtracted from the raw values collected at each PUT to provide the normalization of the collected data.

Finally, the mean and standard deviation are calculated for the set of normalized values produced by the array measurements. Individual values which differ from this mean by more than a specified number of standard deviations indicate an anomaly in the IC at that array location.

At operation 1016, the determination is output. For example, program 232 or the like may be output the result to a display attached to the display interface 226. The output may indicate identification and/or description of the transmitted pulse sequence, information regarding the pulse sequence detected at the pulse detector, detected pulse width characteristics, and a description and/or illustration of one or more signal paths in the path under test. After operation 1018, the process 1000 terminates.

Certain example embodiments provide for detailed characterization of ICs such as, for example, FPGAs and appropriately designed ASIC devices. The products of this characterization can be used for a number of important applications. The ability to detect anomalous values has application in the detection of hardware Trojans, detecting component faults, and measuring device aging all of which present anomalies detectable by one or more example embodiments.

In addition, the increased understanding of the variation, in a particular part of a device and/or circuit, can be used to enable variation aware design practices, provide better estimates of power consumption, to provide better estimates for design timing analysis, and to produce physically uncloneable devices.

Increased knowledge of the capacitance and delay at each point in the part as provided for by example embodiments, instead of the statistical averages traditionally used, may enable designers to optimize design performance by selectively choosing faster paths or to optimize power usage by choosing lower capacitance nets.

Also, because example embodiments extract the systematic variation in the part, what is left after this process is a stronger measure of the variation observed in the particular part measured. In other words, the result is information unique to the part instance that can contribute to the creation of a physically uncloneable function in the part. This unique information can be reproduced only by re-measuring the same part instance thus demonstrating a function only reproducible on that instance.

Certain example embodiments can be used for hardware assurance, such as, for example, Trojan detection. Other uses may include detection of reliability, aging, fault detection, and forensics. Physical uncloneable function (PUF), unique ID creation, variation-aware design practices, and timing/power analysis are other capabilities provided by certain example embodiments.

It will be appreciated that as used herein, the terms system, subsystem, service, programmed logic circuitry, and the like may be implemented as any suitable combination of software, hardware, firmware, and/or the like. It also will be appreciated that the storage locations herein may be any suitable combination of disk drive devices, memory locations, solid state drives, CD-ROMs, DVDs, tape backups, storage area network (SAN) systems, and/or any other appropriate tangible computer readable storage medium. It also will be appreciated that the techniques described herein may be accomplished by having a processor (e.g., central processing unit (CPU) or specialized processor) execute instructions that may be tangibly stored on a computer readable storage medium.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A system for characterizing and/or testing a circuit, comprising:
   a pulse generator incorporated in the circuit and coupled to at least one active signal path in the circuit at a signal input thereof, the pulse generator being configured to generate a sequence of pulses of varying pulse widths for propagation through the at least one active signal path; and a pulse detector incorporated in the circuit and coupled to a signal output of the at least one active signal path and configured to detect respective pulses in the sequence of pulses propagated through the at least one active signal path wherein the pulse generator is configured to generate the pulses by ANDing two clock signals from clocks of the circuit, and wherein the ANDing is performed on clock signals near each other in frequency to produce narrow pulse widths, with the frequency difference between the clock signals being increasable to produce larger pulse widths.

2. The system of claim 1, wherein the pulse generator is configured to generate the pulses by logically combining two clock signals generated by existing clock generation circuitry within the circuit being characterized and/or tested.

3. The system of claim 1, wherein the two clocks are used to generate the pulses such that the pulses have varying pulse widths with a known distribution.

4. The system of claim 1, wherein the sequence of pulse widths alternates between increasing and decreasing by a fixed amount the pulse width between two extremes.

5. The system of claim 4, wherein the fixed amount is on the order of 1 ps.

6. The system of claim 1, wherein the detected pulses detected at the pulse detector are analyzed to yield a characterization of the at least one active signal path.

7. The system of claim 6, wherein characterization of the pulse width distribution that is propagated through the at least one active signal path indicates whether there has been a modification of, and/or attachment of additional logic to, the at least one active signal path.

8. The system of claim 6, wherein the characterization is based on known capacitive thresholds of each type of various logic elements along the at least one active signal path, the pulse sequence provided by the pulse generator, and the detected pulses.

9. The system of claim 1, wherein:
a sequence of pulses of a common distribution of pulse-widths are propagated through a set of equivalent paths under test and then counted at detectors to determine count values, the set of equivalent paths under test being equivalent to the at least one active signal path;
statistics of the count values are determined; and
a determination as to whether the at least one active signal path is behaving anomalously is based on the determined statistics.

10. The system of claim 9, wherein:
the statistics include the mean and standard deviation of the count values, and
the determination as to whether the at least one active signal path is behaving anomalously is based on whether counts from the at least one active signal path vary from the mean by more than a specified amount.

11. The system of claim 1, further comprising a processor configured to detect differences in circuit capacitive loading in the at least one active signal path based on pulse width of detected pulses.

12. A method for characterizing and/or testing a circuit, the method comprising:

configuring a pulse generator, incorporated in the circuit and coupled to at least one active signal path in the circuit at a signal input thereof, to generate a sequence of pulses of varying pulse widths for propagation through the at least one active signal path; and configuring a pulse detector, incorporated in the circuit and coupled to a signal output of the at least one active signal path, to detect respective pulses in the sequence of pulses propagated through the at least one active signal path wherein the pulse generator is configured to generate the pulses by ANDing two clock signals from clocks of the circuit, and wherein the ANDing is performed on clock signals near each other in frequency to produce narrow pulse widths, with the frequency difference between the clock signals being increasable to produce larger pulse widths.

13. The method of claim 12, wherein:
the two clocks are used to generate the pulses such that the pulses have varying pulse widths with a known distribution.

14. The method of claim 12, further comprising analyzing the detected pulses detected at the pulse detector to yield a characterization of the at least one active signal path,
wherein characterization of the pulse width distribution that is propagated through the at least one active signal path indicates whether there has been a modification of, and/or attachment of additional logic to, the at least one active signal path.

15. The method of claim 14, wherein the characterization is based on known capacitive thresholds of each type of various logic elements along the at least one active signal path, the pulse sequence provided by the pulse generator, and the detected pulses.

16. The method of claim 12, wherein:
a sequence of pulses of a common distribution of pulse-widths are propagated through a set of equivalent paths under test and then counted at detectors to determine count values, the set of equivalent paths under test being equivalent to the at least one active signal path;
statistics of the count values are determined; and
a determination as to whether the at least one active signal path is behaving anomalously is based on the determined statistics.

17. The method of claim 16, wherein:
the statistics include the mean and standard deviation of the count values, and
the determination as to whether the at least one active signal path is behaving anomalously is based on whether counts from the at least one active signal path vary from the mean by more than a specified amount.

18. The method of claim 12, further comprising detecting differences in circuit capacitive loading in the at least one active signal path based on pulse width of detected pulses.

19. The method of claim 12, wherein the sequence of pulse widths alternates between increasing and decreasing by a fixed amount the pulse width between two extremes.

20. The method of claim 19, wherein the fixed amount is on the order of 1 ps.

* * * * *